(12) United States Patent
Nguyen et al.

(10) Patent No.: US 9,369,152 B2
(45) Date of Patent: Jun. 14, 2016

(54) SYSTEMS AND METHODS FOR DECODING WITH LATE RELIABILITY INFORMATION

(71) Applicant: Marvell World Trade Ltd., St. Michael (BB)

(72) Inventors: Dung Viet Nguyen, San Jose, CA (US); Shashi Kiran Chilappagari, San Jose, CA (US); Phong Sy Nguyen, Santa Clara, CA (US)

(73) Assignee: Marvell World Trade Ltd., St. Michael (BB)

( * ) Notice: Subject to any disclaimer, the term of this patent is extended or adjusted under 35 U.S.C. 154(b) by 135 days.

(21) Appl. No.: 14/197,408

(22) Filed: Mar. 5, 2014

(65) Prior Publication Data

US 2014/0258809 A1    Sep. 11, 2014

Related U.S. Application Data

(60) Provisional application No. 61/774,167, filed on Mar. 7, 2013.

(51) Int. Cl.
*H03M 13/11* (2006.01)
*H04L 1/00* (2006.01)
(Continued)

(52) U.S. Cl.
CPC ....... *H03M 13/1111* (2013.01); *G06F 11/1068* (2013.01); *G11C 29/00* (2013.01); *H03M 13/1105* (2013.01); *H03M 13/116* (2013.01); *H03M 13/1108* (2013.01); *H03M 13/255* (2013.01); *H03M 13/2957* (2013.01); *H03M 13/37* (2013.01); *H03M 13/3707* (2013.01); *H03M 13/4138* (2013.01); *H04L 1/005* (2013.01); *H04L 1/0052* (2013.01); *H04L 1/0057* (2013.01)

(58) Field of Classification Search
CPC ............... H03M 13/1111; H03M 13/1108; H03M 13/116; H03M 13/3707; H03M 13/1105; H03M 13/2957; H03M 13/4138; H03M 13/255; H03M 13/37; G06F 11/1068; H04L 1/005; H04L 1/0052; H04L 1/0057; G11C 29/00
USPC ......... 714/758, 752, 755, 774, 763, 780, 793, 714/759, 764, 786, 791
See application file for complete search history.

(56) References Cited

U.S. PATENT DOCUMENTS 8,312,354 B1 * 11/2012 Varnica ............ H03M 13/1105
   714/780
8,443,267 B2    5/2013 Zhong et al.
(Continued)

FOREIGN PATENT DOCUMENTS

WO    WO-2009072103 A2    6/2009

OTHER PUBLICATIONS

International Search Report and Written Opinion dated Aug. 7, 2014 in International Application No. PCT/US2014/020775.
(Continued)

*Primary Examiner* — John J Tabone, Jr.

(57) ABSTRACT

Systems and methods are provided for decoding data. A variable node value for a variable node is received at a first time, and reliability data for the variable node is received at a second time. The variable node is decoded using a first decoding scheme after the first time and before the second time, and the variable node is decoded using a second decoding scheme different from the first decoding scheme after the second time.

20 Claims, 5 Drawing Sheets

(51) Int. Cl.
*H03M 13/37* (2006.01)
*H03M 13/29* (2006.01)
*G06F 11/10* (2006.01)
*G11C 29/00* (2006.01)
*H03M 13/41* (2006.01)
*H03M 13/25* (2006.01)

(56) References Cited

U.S. PATENT DOCUMENTS

| | | | | |
|---|---|---|---|---|
| 8,495,453 B1 * | 7/2013 | Varnica | ............ | H03M 13/1137 714/752 |
| 8,694,868 B1 * | 4/2014 | Chilappagari | .... | H03M 13/1108 714/752 |
| 8,819,530 B1 * | 8/2014 | Yeo | ................... | H03M 13/1117 714/795 |
| 8,862,970 B1 * | 10/2014 | Varnica | ............ | H03M 13/1111 714/752 |
| 8,910,028 B1 * | 12/2014 | Li | ........................... | H04L 1/005 714/752 |
| 8,930,797 B2 | 1/2015 | Haratsch | | |
| 8,938,660 B1 * | 1/2015 | Varnica | ................. | H03M 13/00 714/755 |
| 8,984,378 B1 * | 3/2015 | Chilappagari | .... | H03M 13/1108 714/752 |
| 9,003,267 B2 * | 4/2015 | Varnica | .............. | H03M 13/112 714/760 |
| 9,009,578 B1 * | 4/2015 | Varnica | ................. | H03M 13/37 714/785 |
| 9,065,484 B2 | 6/2015 | Sandberg et al. | | |
| 9,083,383 B1 | 7/2015 | Tunali et al. | | |
| 2005/0166129 A1 | 7/2005 | Yano et al. | | |
| 2006/0190797 A1 * | 8/2006 | Xin | ................... | H03M 13/1105 714/758 |
| 2009/0177931 A1 * | 7/2009 | Song | ................... | G06F 11/1012 714/704 |
| 2009/0234792 A1 * | 9/2009 | Kim | ..................... | G06N 99/005 706/50 |
| 2010/0037121 A1 | 2/2010 | Jin et al. | | |
| 2010/0077279 A1 | 3/2010 | Kim et al. | | |
| 2010/0174959 A1 * | 7/2010 | No | .................... | H03M 13/1108 714/746 |
| 2010/0275096 A1 | 10/2010 | Zhong et al. | | |
| 2011/0191653 A1 * | 8/2011 | Zeng | ................. | H03M 13/1111 714/763 |
| 2011/0246849 A1 | 10/2011 | Rault et al. | | |
| 2012/0079355 A1 | 3/2012 | Patapoutian et al. | | |
| 2012/0224420 A1 | 9/2012 | Sakurada et al. | | |
| 2012/0240007 A1 * | 9/2012 | Barndt | .............. | H03M 13/1108 714/758 |
| 2012/0317462 A1 | 12/2012 | Liu et al. | | |
| 2013/0073922 A1 * | 3/2013 | Varnica | ............ | H03M 13/1105 714/758 |
| 2013/0139035 A1 | 5/2013 | Zhong et al. | | |
| 2013/0173985 A1 * | 7/2013 | Chung | ............. | H03M 13/1111 714/755 |
| 2013/0173988 A1 | 7/2013 | Chen et al. | | |
| 2013/0305114 A1 | 11/2013 | Olcay et al. | | |
| 2014/0108883 A1 | 4/2014 | Tehrani et al. | | |
| 2014/0164866 A1 * | 6/2014 | Bolotov | ............ | H03M 13/1111 714/758 |
| 2014/0245098 A1 * | 8/2014 | Sharon | ................ | G06F 11/1012 714/755 |
| 2014/0289584 A1 * | 9/2014 | Chilappagari | ...... | G06F 11/1068 714/755 |
| 2015/0169406 A1 * | 6/2015 | Li | ....................... | G06F 11/1076 714/763 |
| 2015/0220389 A1 * | 8/2015 | Kim | .................... | G06F 11/1068 714/764 |

OTHER PUBLICATIONS

International Search Report and Written Opinion dated Aug. 7, 2014 in International Application No. PCT/US2014/020644.

"VLSI Implementation of a High-Throughput Soft-Bit-Flipping Decoder for Geometric LDPC Codes", Junho Cho et al, IEEE Transactions on Circuits and Systems I: Regular Papers 57:5, May 1, 2010, pp. 1083-1094.

"An Improvement on the Modified Weighted Bit Flipping Decoding Algorithm for LDPC Codes", Ming Jiang et al, IEE Communications Letters 9:9, pp. 814-816.

International Search Report and Written Opinion issued Apr. 1, 2014 in International Application No. PCT/US2014/014697.

\* cited by examiner

SYSTEMS AND METHODS FOR DECODING WITH LATE RELIABILITY INFORMATION

CROSS REFERENCE TO RELATED APPLICATIONS

This disclosure claims the benefit under 35 U.S.C. §119(e) of U.S. Provisional Application No. 61/774,167, filed on Mar. 7, 2013, which is incorporated herein by reference in its entirety.

FIELD OF USE

This disclosure relates generally to data decoding, and more particularly to decoders with reliability inputs for data encoded with a low density parity check (LDPC) encoder.

BACKGROUND

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy data storage or communications channel. The information may be encoded (by a LDPC encoder) prior to transmission and then subsequently decoded (by a LDPC decoder) when received. LDPC codes are one of the best performing error correction codes, along with Turbo codes, for use in correcting errors in information transmitted on communication and data storage channels.

Conventional hard decoding LDPC techniques typically determine whether to flip a bit or update the value of a symbol based only on whether a given number of checks are unsatisfied. For example, values of one or more symbols may be selected to be updated based on which combination of updated symbols is most likely to reduce the number of unsatisfied check nodes.

SUMMARY

In accordance with an implementation of the disclosure, systems and methods are provided for decoding data. A variable node value for a variable node is received at a first time, and reliability data for the variable node is received at a second time. The variable node is decoded using a first decoding scheme after the first time and before the second time, and the variable node is decoded using a second decoding scheme different from the first decoding scheme after the second time.

In some implementations, the first decoding scheme is a hard decoding scheme based on the variable node value. The second decoding scheme is a soft decoding scheme based on the variable node value and the reliability data.

In some implementations, additional reliability data for the variable node is received at a third time later than the second time, and the variable node is decoded using a third decoding scheme after the third time.

In some implementations, receiving the variable node value for the variable node comprises transmitting an instruction to perform a read operation on a memory. Receiving the reliability data for the variable node comprises transmitting an instruction to perform one or more additional read operations on the memory. The memory may be a NAND flash memory.

A result of the first decoding scheme may be stored in a buffer, where decoding the variable node using the second decoding scheme includes retrieving the result of the first decoding scheme from the buffer.

In some implementations, if the first decoding scheme is successful, the decoding is terminated before the second time. Receiving the reliability data at the second time and decoding the variable node using the second decoding scheme may be performed in response to determining that the first decoding scheme is unsuccessful.

In accordance with an implementation of the disclosure, a decoder comprises decoding circuitry. The decoding circuitry is configured to receive a variable node value for a variable node at a first time and receive reliability data for the variable node at a second time. The variable node is decoded using a first decoding scheme after the first time and before the second time, and the variable node is decoded using a second decoding scheme different from the first decoding scheme after the second time.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

This disclosure generally relates to performing decoding at a decoder. To provide an overall understanding of the disclosure, certain illustrative embodiments will now be described, including a multi-stage decoder that performs decoding based on late reliability information. However, it will be understood by one of ordinary skill in the art that the systems and methods described herein may be adapted and modified as is appropriate for the application being addressed, and that the systems and methods described herein may be employed in other suitable applications, and that such other additions and modifications will not depart from the scope thereof.

In some communication systems, such as certain flash memory units, data estimates (or hard decision data) are made available to a decoder before reliability data regarding the hard decisions is available. Rather than forcing a soft decoder to wait until both the hard decisions and reliability data are available before decoding begins, the systems and methods described herein allow decoding in multiple stages. The decoding systems and methods of the present disclosure perform hard decoding in a first stage, when the hard decisions are available. Later, when a certain amount of reliability data is available, soft decoding is performed in a second stage that makes use of both the hard decisions and the reliability data. Optionally, additional soft decoding stages are used as additional reliability data is received. Such multi-stage decoders are referred to herein as late reliability decoders.

Figure 1:
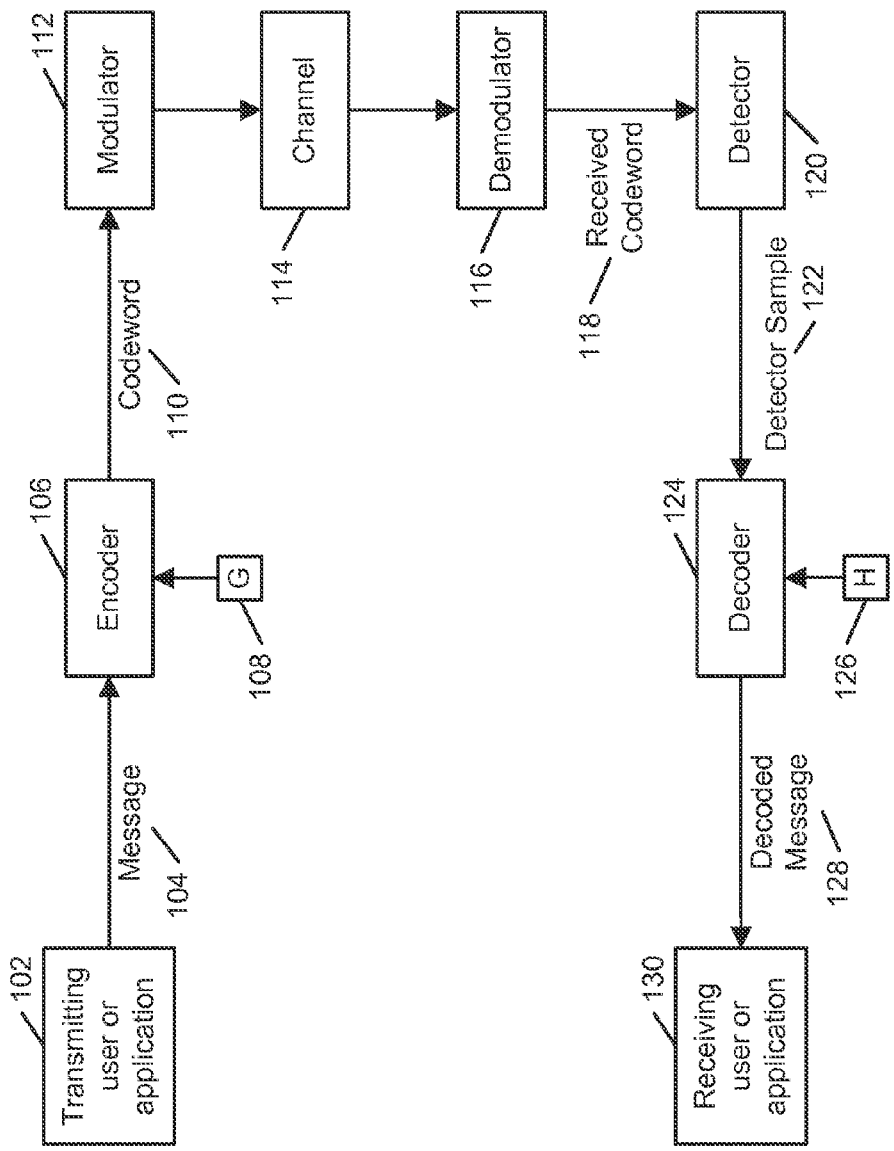
FIG. 1 is a block diagram of an illustrative communications system employing LDPC decoding, in accordance with an embodiment of the present disclosure.

FIG. 1 shows an illustrative communications system 100 for LDPC decoding based, in part, on reliability inputs, in accordance with some embodiments of the present disclosure. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1). The information produced by the transmitting user or application 102 may correspond to voice information, video information, financial information, or any other type of information that may be represented in digital or analog form, and the data stream produced by transmitting user or application 102 may be a digital data stream.

The transmitting user or application 102 may segment or otherwise divide the data stream into blocks of a fixed length of k symbols. In particular, a message 104, also referred to as m, represents one of these blocks. In particular, the message 104 is k symbols in length, where each symbol may be binary data or non-binary data such as ternary data, quaternary data, any other suitable type of data, or any suitable combination thereof. An encoder 106 is used to encode the message 104 to produce a codeword 110. In one embodiment of the present disclosure, the encoder 106 is an LDPC encoder. However, based on the disclosure and teachings provided herein, it should be clear that the encoder 106 may be any other suitable encoder. The codeword 110, also referred to as c, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an embodiment, the encoder 106 produces the codeword 110 from the message 104 using the generator matrix G 108 by the following matrix multiplication:

c=G m.

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes, or is stored on, before being recovered at a demodulator 116. For example, the channel 114 may be a storage channel that represents a storage medium in a computer system environment, or a communications channel that represents the wireless propagation environment in a wireless communications environment. Various characteristics of the channel 114 may corrupt data that is communicated or stored thereon. For example, the channel 114 may be a non-ideal memoryless channel or a channel with memory; the channel 114 may be an erasure channel, and may be symmetric or asymmetric. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

The received codeword 118 contains information related to the codeword 110 and may be a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codeword 118 to produce a detector sample 122, which may be an estimate of the original data message 104, also referred to herein as one or more hard decisions. The detector 120 samples each symbol in the received codeword 118 and assigns each symbol to a bin based on the symbol's value. In some embodiments, the bin is assigned based on a probability distribution. Each symbol sampled by the detector 120 may be assigned to one of two or more possible bins or states. The states that are determined for the detector sample 122 are stored in memory as the sample codeword. This memory is termed the "hard decision memory," which may be in a different memory location from the received codeword 118.

In some embodiments, the channel 114 is read multiple times, and the multiple reads may be processed jointly or separately by the demodulator 116, the detector 120, or both to generate reliability data in addition to the hard decision sample codeword. For example, to determine the input state of a given symbol stored in a flash memory storage device, the memory cell in which the received value of the symbol is stored may be read more than once. Multiple reads of the channel 114 corresponding to the same symbol may be processed by the detector 120 to generate detector sample 122 in the form of reliability data and hard decision data. For example, in a binary code, multiple reads of the channel 114 may be processed by the demodulator 116, the detector 120, or both to generate one bit of hard decision data and one bit of reliability data for each bit in the sample codeword. In another example, two bits of reliability data may be generated for each bit in the sample codeword. In general, any number of bits of reliability data may be generated for each bit in the sample codeword. Such reliability data may be stored in a "reliability data memory" location that is separate from the hard decision memory, or may be stored together with the hard decisions in the same memory location. Both hard decision and reliability data in the form of detector sample 122 are transmitted to a decoder 124 as input for subsequent decoding operations.

The decoder 124 receives and iteratively processes the detector sample 122 in multiple stages. The detector 120 and the decoder 124 may be two separate processors, or a single processor may be used as both the detector 120 and decoder 124. In general, the decoder 124 comprises control circuitry and/or decoding circuitry used to iteratively correct and/or detect errors present in the detector sample 122, for example, due to transmission through the channel 114. In some embodiments, the decoder 124 uses the parity check matrix H 126 and a decoding technique to produce a decoded message 128. In general, LDPC decoding can be described using a mathematical vector model $Hc=\vec{0}$, in which c is a binary string of length n and H is the parity check matrix H 126, which is a low-density, sparse m×n matrix, wherein, as above, n is the number of symbols in the codeword, m is the number of check nodes satisfying m≥n−k, and k is the number of symbols in the message. The model is satisfied only when the binary string c is the codeword c 110. The parity check matrix H 126 is not necessarily unique, and may be chosen to be computationally convenient, to decrease the number of errors generated by the decoding technique of the decoder 124, or both.

In accordance with the present disclosure, the multi-stage decoding technique used by the decoder 124 involves processing detector samples 122 by updating symbols, reliability data, or both based on one or more "update rules." In an example, an update rule may be based on whether checks of the symbol are satisfied or unsatisfied, whether the symbol has been previously updated, flipped, or toggled, based on the value of the reliability data, or a suitable combination thereof. Generally, as used herein, "flipping" or "toggling" a symbol means to update a value of the symbol to a different value than the current value. The update rules and system architectures for performing the symbol flipping or toggling are described in Varnica et al. U.S. patent application Ser. No. 14/172,420, filed Feb. 4, 2014, which is hereby incorporated by reference herein in its entirety.

After processing, each symbol in the decoded message 128 should be assigned as one state in a set of possible states. When input into the model $Hc=\vec{0}$ as c, the decoded message 128 satisfies the model. Suitable systems and processes for performing decoding are described in relation to FIGS. 3-5.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the decoder 124 corrects all errors that are induced by the channel 114 and other communications effects in the communications system 100, then the decoded message 128 is a logical replica of the message 104. Otherwise, the decoded message 128 may differ from the message 104, and the decoder 124 may declare an error accordingly.

Figure 2:
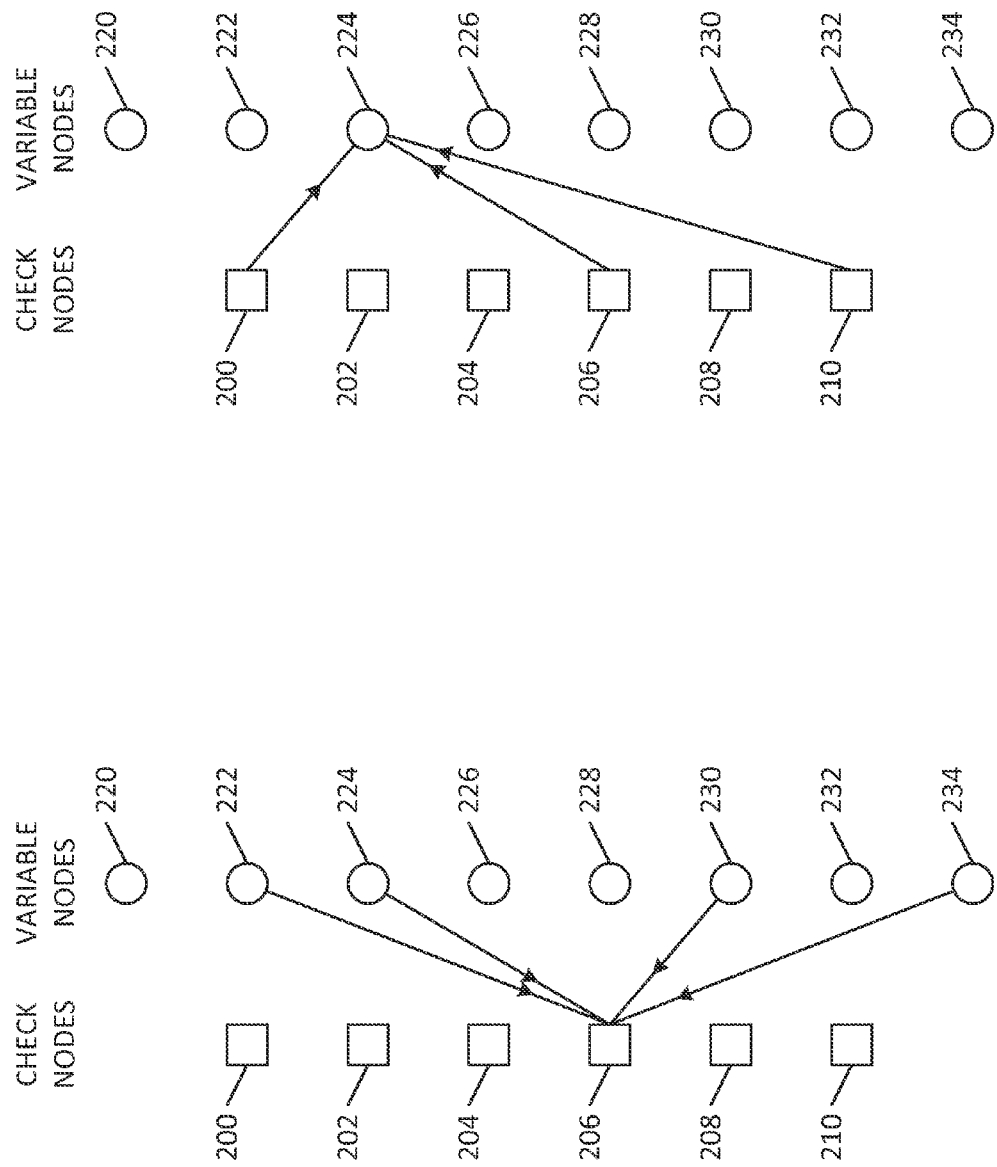
FIGS. 2A and 2B are graphical illustrations of communications between variable nodes representing symbols of a received codeword and check nodes for decoding the received codeword, in accordance with an embodiment of the present disclosure.

FIGS. 2A and 2B are graphical illustrations of communications between variable nodes 220-234 representing an example codeword and check nodes 200-210 for decoding the codeword using variable reliability information, in accordance with an embodiment of the present disclosure.

Upon initialization of the decoding process, variable nodes 220-234 are assigned input states using the detector 120 as described in relation to FIG. 1, where both hard decision and reliability information may be taken into account. As discussed herein, a "variable node value" refers to the hard decision associated with a variable node, while "variable reliability data" refers to the reliability data associated with the variable node or variable node value. An input state may include one or both of the variable node value and the variable reliability data.

In one illustrative example, every variable node is associated with a two-bit input denoted by $[b_1\ b_0]$, where the value of the bit $b_0$ indicates the hard decision and the value of the bit $b_1$ indicates the reliability of the hard decision. In a binary code, $b_0$ may take on values 0 or 1, representing the two possible hard decision states of a decoded bit. Correspondingly, $b_1$ may also take on values 0 or 1, where 0 represents an unreliable hard decision, and 1 represents a reliable hard decision. In other words, an input of 10 to a variable node may be interpreted as a reliable decision of 0, an input of 00 to a variable node may be interpreted as an unreliable decision of 0, an input of 01 to a variable node may be interpreted as an unreliable decision of 1, and an input of 11 to a variable node may be interpreted as a reliable decision of 1. In general, any number (k) of reliability bits may be used, and the (k+1)-bit input may be denoted by: $[b_k\ b_{k-1}\ \ldots\ b_1\ b_0]$.

Hard decoding systems perform decoding on the hard decision data, while soft decoding systems perform decoding on both the hard decision data as well as the reliability data. In the multi-stage decoder of the present disclosure, the decoder may perform hard decoding when only the hard decision data is available, and perform soft decoding as the reliability data becomes available. In particular, in some systems, such as certain flash memory units, the hard decision data is made available to the decoder before the corresponding reliability data is available. This may occur because the hard decision is available after the channel 114 is read a single time, and the reliability data is only available after a number of additional reads. In an example, two additional reads may be sufficient to render one bit of reliability data, and further additional reads may render additional bits of reliability data.

The system requirements for performing each read may be associated with a higher cost than performing the actual decoding. For example, the time it takes to perform a single read may be significantly longer than the time it takes to perform the decoding. Because hard decoding may be successful in recovering a valid codeword after receiving only the hard decision and before any reliability data is received, it may be desirable to determine whether hard decoding has been successful before performing any additional reads to recover reliability data. Similarly, if soft decoding is successful after a certain number of reads, it may be undesirable to perform additional unnecessary reads. In a system with throughput and power constraints, the multi-stage decoder of the present disclosure provides for efficient decoding by making use of the hard decision data and the reliability data as it is received.

The hard decision and reliability data input may be stored together in one memory location as input states, or separately in a hard decision memory and a reliability data memory. As described herein, only one bit is used to represent the hard decision and only one bit is used to represent the reliability of the hard decision. However, in general, any number of bits may be used to represent the hard decision, the reliability, or both. In particular, the hard decision may take on more than two values for non-binary codes, and the reliability messages may carry one or more bits or symbols.

After the variable nodes 220-234 are assigned input states using the detector 120 as described in relation to FIG. 1, a check of the variable nodes is performed by the decoder 124 on a plurality of groups of variable nodes. The decoder 124 uses processing rules to determine a condition of a group of variable nodes. An indication of the determined condition is stored in syndrome memory at a check node, such as check nodes 200-210. The parity check matrix H 126 (FIG. 1) identifies which check nodes store indications of the determined conditions for which variable nodes. For example, for the nodes pictured in FIGS. 2A and 2B and for a binary code example, the parity check matrix H 126 may be as follows $$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row corresponds to one of the check nodes, and each column corresponds to one of the variable nodes. With binary codes, the elements of the parity check matrix are 0 or 1, as shown above. As used herein, a "neighboring" check node of a variable node is a check node that has a connection to the variable node. Similarly, a "neighboring" variable node of a check node is a variable node that has a connection to the check node. The parity check matrix H 126 shown above provides indications of the connections between check nodes and variable nodes. In particular, as shown in FIG. 2A, variable nodes 222, 224, 230, and 234 are neighbors of check node 206, and as shown in FIG. 2B, check nodes 200, 206, and 210 are neighbors of variable node 224. Furthermore, in binary codes, each check node has one of two states, 0 if the check is satisfied, and 1 if the check is unsatisfied. For a non-binary code, the elements of the parity check matrix are non-binary, and each check node is one of more than two states. Each row of the parity check matrix forms the coefficients of a parity check equation, which is computed in the non-binary domain.

The decoder 124 references the parity check matrix H 126 to identify variable nodes associated with a particular check node, or variable nodes that should be checked by the particular check node. For example, for the check node 206, the decoder 124 uses fourth row of the parity check matrix H 126 to determine that that check node 206 stores the result of a check of variable nodes 222, 224, 230, and 234 (i.e., the second, third, sixth, and eighth variable nodes). Then, the decoder 124 retrieves the values stored in these variable nodes. The values in the fourth row of the above parity check matrix H are the coefficients of a parity check equation, which are each multiplied by the corresponding values of the variable nodes. For illustration, the arrows in FIG. 2A indicate that the retrieved values flow from the variable nodes 222, 224, 230, and 234 to the check node 206, and the check node 206 may be considered to "check" the variable nodes 222, 224, 230, and 234. The variable node values are retrieved by the decoder 124, which processes the values on behalf of the check node 206 according to the processing rules.

From the values received from the variable nodes 222, 224, 230, and 234, the decoder 124 determines whether a given condition for the check node 206 is satisfied or is unsatisfied. An indication of whether the check node 206 is satisfied or unsatisfied (i.e., the "syndrome value" or the "check node value" of the check node) is stored in syndrome memory, which stores syndrome values or indications of the check nodes. In addition, reliability of the syndrome values of the check nodes may be updated based on values and reliability of associated variable nodes.

After the indications or syndrome values for the check nodes 200-210 have been stored in the syndrome memory, the values of the variable nodes 220-234 may be updated based on the values of the check nodes and reliability of the variable nodes. The parity check matrix H 126 is again used by the decoder 124 to determine which check nodes should be accessed for a particular variable node. As illustrated in FIG. 2B, for updating the variable node 224, the parity check matrix H 126 given above indicates that check nodes 200, 206, and 210 (i.e., the first, fourth, and sixth variable nodes) should be referenced. Based on the indications of the referenced check nodes, the state of the variable node 224 may be updated.

In some embodiments of the present disclosure, the value of the variable node 224 may also be determined based, in part, on whether the variable node 224 had previously been updated, toggled, or flipped. The check nodes and variable nodes may be iteratively updated until all check nodes are satisfied (i.e., an all-zero syndrome is achieved) or until a maximum number of iterations has been reached. The output of the decoder 124 is the content of the hard-decision memory upon termination of the decoding process, or the decoded message 128.

Figure 3:
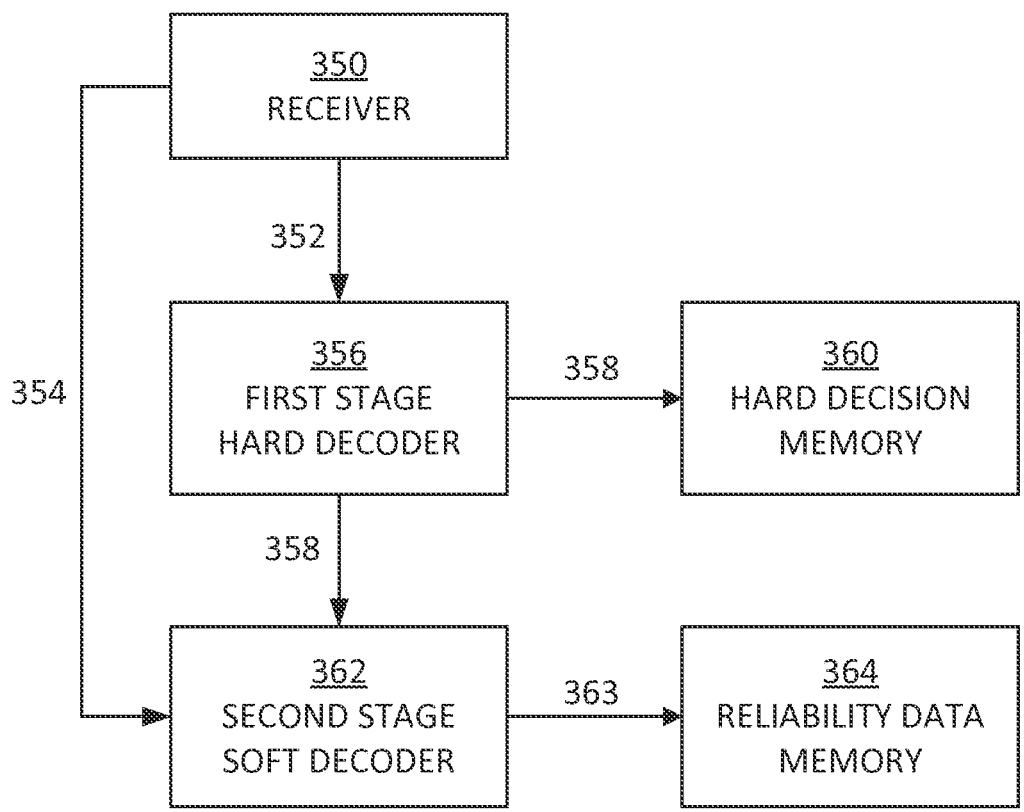
FIG. 3 is a block diagram of an illustrative system for decoding based on late reliability information, in accordance with an embodiment of the present disclosure.

FIG. 3 is a block diagram of an illustrative multi-stage decoder system 300 for LDPC decoding using late reliability inputs, in accordance with an embodiment of the present disclosure. System 300 may implement the decoding process as illustrated by FIGS. 2A and 2B. Receiver 350 receives hard decision data and reliability data as one or more reads of channel 114 are performed. Because hard decision data result from a single read and reliability data result from multiple reads, hard decision data (denoted $b_0$) are received before the reliability data (denoted $[b_k\ b_{k-1} \ldots b_1]$) are received.

A first stage hard decoder 356 of the multi-stage decoder receives the hard decision data 352 from the receiver 350 and performs hard decoding. First stage hard decoder 356 may perform hard decoding by determining whether to update a variable node value based on whether a number of check nodes associated with the variable node are satisfied or unsatisfied. In an example, the value of one or more variable nodes may be selectively updated based on which combination of updated variable node values would be most likely to reduce the number of unsatisfied check nodes. First stage hard decoder 356 outputs updated hard decisions 358, which are stored in hard decision memory 360 and are optionally transmitted to second stage soft decoder 362.

Second stage soft decoder 362 receives reliability data 354 from receiver 350 and updated hard decisions 358 from first stage hard decoder 356. Second stage soft decoder 362 performs soft decoding based on the reliability data 354 and the hard decisions 358. The soft decoding performed by second stage soft decoder 362 may include determining whether to update the hard decisions 358, the reliability data 354, or both, based on one or more update rules. In an example, an update rule may be based on whether check nodes associated with a variable node are satisfied or unsatisfied, whether the variable node has been previously updated based on the reliability data, or a combination thereof. The output of second stage soft decoder 362 may include updated reliability data 363, which are stored in reliability data memory 364. Moreover, if second stage soft decoder 362 updated the hard decisions 358, second stage soft decoder 362 may store the updated hard decisions in hard decision memory 360.

As shown in FIG. 3, a single second stage soft decoder 362 is used. However, in general, any number of additional second stage soft decoders may be used as additional reliability data are received. In particular, for k incoming bits of reliability data, k stages of soft decoders may be used, each associated with a corresponding number of reliability data bits.

In some embodiments, use of second stage soft decoder 362 and any additional soft decoders are optional. For example, the hard decoding performed by first stage hard decoder 356 may be successful, and thus additional reliability data are not needed. In this case, a controller may be instructed to not perform any additional reads of channel 114 for the current variable node, and second stage soft decoder 362 may be unused. Hybrid system architectures for optionally performing soft decoding in addition to hard decoding are described in Chilappagari et al. U.S. patent application Ser. No. 14/197,426, filed Mar. 5, 2014, which is hereby incorporated by reference herein in its entirety. In another example, the soft decoding performed by the n-th stage soft decoder may be successful, where n may be any integer from 1 to k. In this case, any additional reads of channel 114 for the current variable node may not be performed, and the remaining stages of soft decoders (i.e., n+1 through k) may be unused.

In some embodiments, the multi-stage decoder of system 300 is used in relation to reading data from a NAND flash memory unit. In an example, each read results in one bit of information. In particular, the first read gives rise to the hard decision, or the variable node value, or $b_0$. The second read gives rise to a first bit of reliability data, or $b_1$. A controller may interface with the NAND flash memory to read pages of data that are stored in the memory unit. In order to get multiple bits, the controller issues a read command multiple times.

In an example, the controller may parse through a queue of instructions, which may include read instructions such as "READ PAGE 0," "READ PAGE 1," "READ PAGE 2," etc. A hard decoder may determine that when hard decoding of data read from page 0 fails, there is no need to store the result, and the controller may proceed with attempting to decode data read from page 1. In this case, if it is desirable to later perform decoding of data read from page 0, the controller would have to restart the process and request the first read operation to be performed again.

In some embodiments, the systems described herein include a buffer to store the hard decisions (that result from single reads of the memory) and the reliability data (that result from multiple reads of the memory). Rather than discarding data resulting from one or more read operations, the data is stored in the buffer. In particular, after one or more read operations are performed, the hard decision data and/or the reliability data are stored in the buffer and may be retrieved later so that those one or more read operations do not need to be repeated. In this case, if it is determined that additional reliability data is desirable, then additional read operations may be performed, without having to redo the original one or more read operations. In some embodiments, the NAND flash memory device itself includes a buffer that stores one or more read results. In this case, the data resulting from the read operations is already stored in the NAND device, and the controller only needs to fetch the data when needed.

Figure 4:
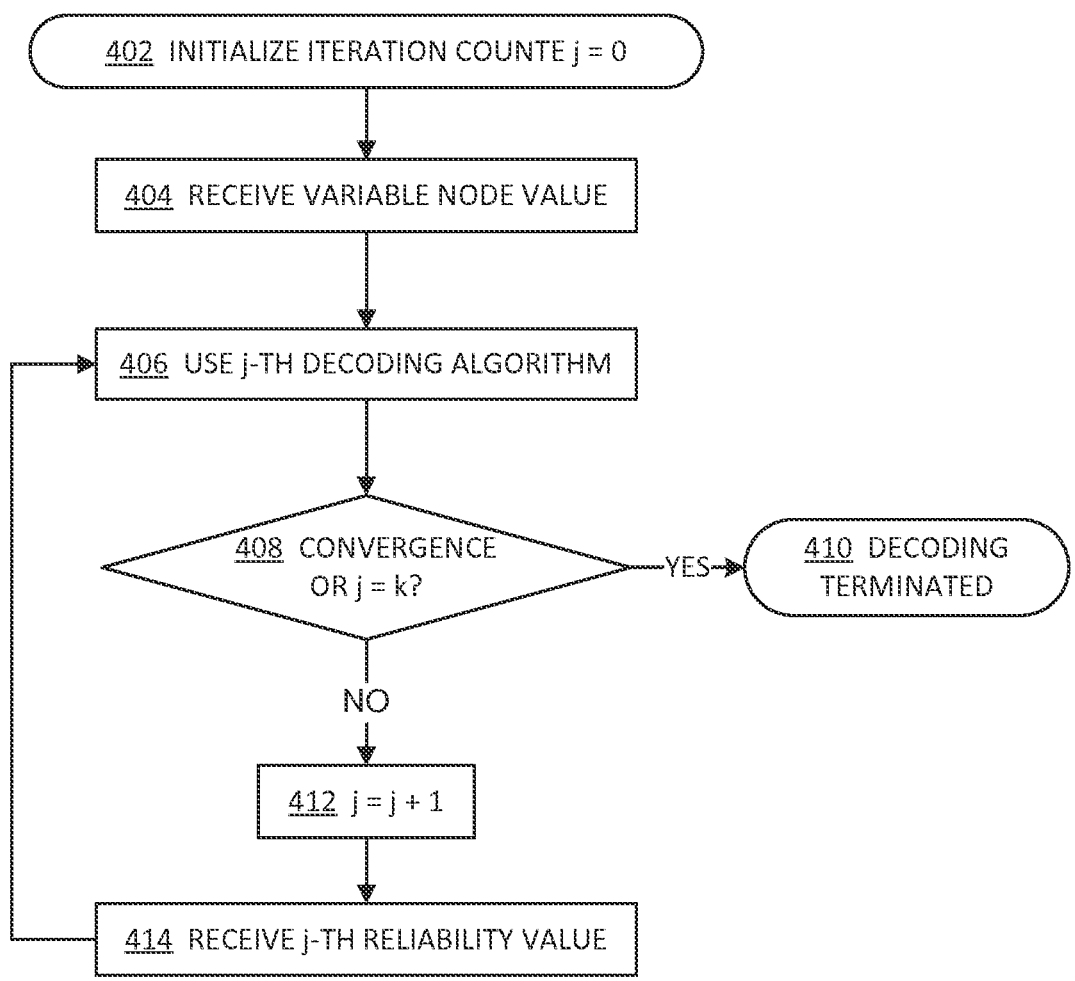
FIG. 4 is a flow chart of an illustrative process for decoding based on late reliability information, in accordance with an embodiment of the present disclosure.

FIG. 4 is a flow chart of an illustrative process 400 for LDPC decoding based on late reliability information, in accordance with an embodiment of the present disclosure. Process 400 may be implemented using the system 300 shown in FIG. 3. At 402, a counter j is initialized to zero. The system 300 is configured to increment the counter j as data is received and attempted decoding of the received data fails. The value of the counter j is incremented until attempted decoding of the received data is successful, or until the value of the counter j reaches the number of reliability symbols k.

At 404, a variable node value is received. The variable node value refers to the hard decision associated with a variable node. In an example, a bit corresponding to the hard decision is referred to herein as $b_0$, which is available at a particular time $t_0$. At 406, first stage hard decoder 356 processes the variable node value received at 404 using a decoding scheme. In particular, the system 300 may be configured to use (k+1) decoding schemes, which may be referred to as the j-th decoding scheme. In particular, when j is zero, the zero-th decoding scheme is a hard decoding scheme that only operates on the received hard decision.

At 408, the system 300 determines whether one or more convergence or termination conditions are satisfied. In an example, convergence or termination may be reached when an all-zero syndrome is achieved or if a maximum number of iterations k has been reached. If any convergence or termination conditions are reached, process 400 proceeds to 410 to terminate the decoding.

Otherwise, if no convergence or termination condition is satisfied, process 400 proceeds to 412 to increment j and to 412 to receive the j-th reliability value. In particular, system 300 may be configured to receive a maximum number of k reliability values, where each subsequent reliability value is associated with an additional read performed on channel 114. When the next j-th reliability value is received at 414, process 400 returns to 406 to use the next j-th decoding scheme. In an example, the j-th reliability value may be referred to as a bit $b_j$, which may be made available to the decoder at a time $t_j = t_{j-1} + T_j$, where $T_j$ is the difference between the time that the (j-1)-th value is available and the time that the j-th value is available. In other words, when j=1, bit $b_1$ is available at time $t_1 = t_0 + T_1$, which is at a time $T_1$ after the time that the hard decision bit $b_0$ is available. Similarly, bit $b_2$ is available at time $t_2 = t_1 + T_2$. In some implementations, $T_1$ is less than $T_2$, which is less than $T_3$, etc. In other implementations, $T_2, T_2, \ldots T_k$ are similar. in general, $T_2, T_2, \ldots T_k$ may be the same or different.

When j is greater than zero (i.e., j=1, 2, ... k), the j-th decoding scheme is a soft decoding scheme that may be performed by a soft decoder such as second stage soft decoder 362. In particular, a soft decoder takes into account both hard decision data as well as reliability data in determining whether to update the hard decision data and/or the reliability data.

As shown in FIGS. 4, 406, 408, 412, and 414 are repeated until a convergence or a termination condition is reached at 408. When convergence is reached, decoding is successful, and the decoding process is terminated at 410. When decoding is successful when j is less than k, the later stages of soft decoding that make use of some of the later reliability information are bypassed. By initiating the decoding process to begin before all of the reliability information is received, and by allowing for termination of the decoding process before all of the reliability information is received, the multi-stage decoder of the present disclosure makes efficient use of system resources.

Figure 5:
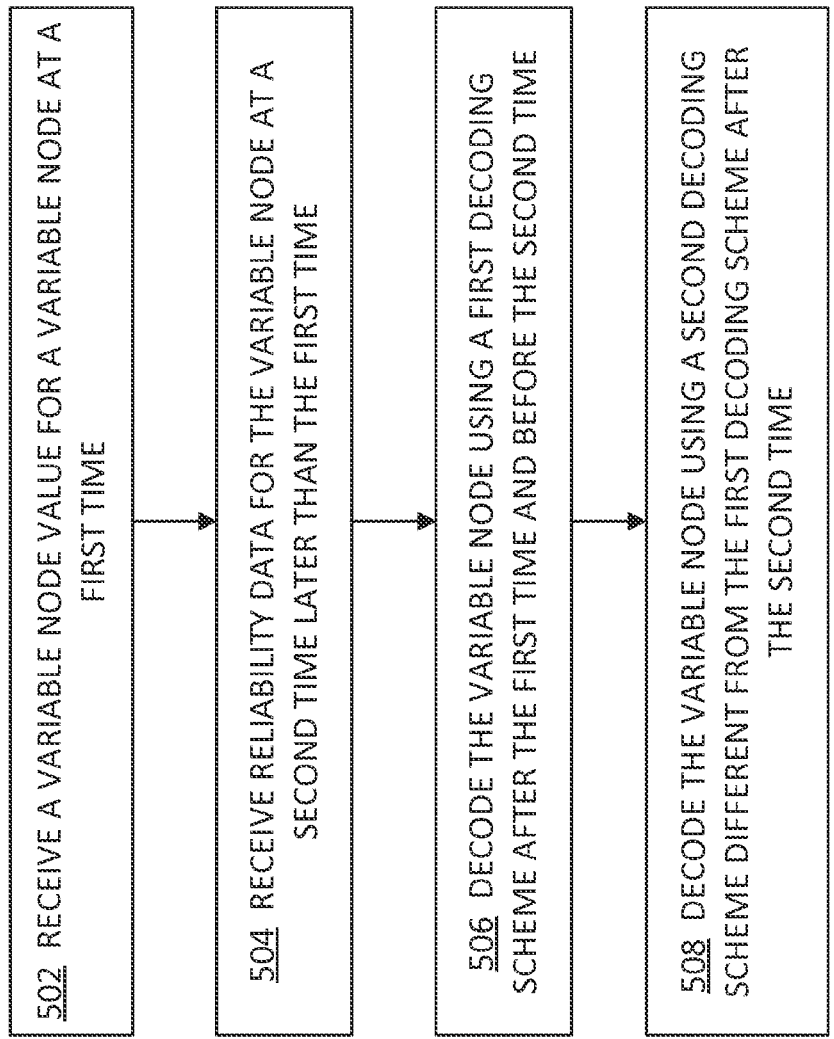
FIG. 5 is a flow chart of an illustrative process for multi-stage decoding based on late reliability information, in accordance with an embodiment of the present disclosure.

FIG. 5 is a flow chart of an illustrative process 500 for multi-stage LDPC decoding based on late reliability information, in accordance with an embodiment of the present disclosure. Process 500 may be implemented using the system 300 shown in FIG. 3. At 502, a variable node value for a variable node is received at a first time. In some embodiments, receiving the variable node value for the variable node includes transmitting an instruction to perform a read operation on a memory. In particular, the memory may be a NAND flash memory device, and a controller may instruct the NAND flash memory device to perform a read operation and transmit the result of the read operation (i.e., a hard decision) to the controller.

At 504, reliability data for the variable node is received at a second time later than the first time. In some embodiments, receiving the reliability data for the variable node includes transmitting an instruction to perform additional read operations on a memory. When the memory is a NAND flash memory device, a controller may instruct the NAND flash memory device to perform one or more additional read operations and transmit the results of the additional read operations to the controller in the form of reliability data.

At 506, the variable node is decoded using a first decoding scheme after the first time and before the second time. The first decoding scheme is a hard decoding scheme and is based on the variable node value and not on any reliability data. In some embodiments, a result of the hard decoding scheme is an updated hard decision value. The originally received hard decision and/or the updated hard decision value may be stored in a buffer such as hard decision memory 360 shown in FIG. 3. In some embodiments, the first decoding scheme includes evaluating whether the hard decoding is successful, such as by determining whether an all-zero syndrome is achieved, for example. If the hard decoding is successful, process 500 may be terminated before the second time, and 504 and 508 may not be performed. Otherwise, if the hard decoding is unsuccessful (which may be determined if an all-zero syndrome is not achieved, for example), 504 and 508 are performed, and process 500 proceeds to 508 to further decode the variable node.

At 508, the variable node is decoded using a second decoding scheme different from the first decoding scheme after the second time. As opposed to the first decoding scheme, the second decoding scheme is a soft decoding scheme and is based on both the variable node value and the reliability data. In some embodiments, the hard decision received at 502 is stored in a hard decision memory, such as hard decision memory 360 shown in FIG. 3. In this case, the second decoding scheme may include retrieving the hard decision or an updated hard decision from hard decision memory 360.

In some embodiments, additional reliability data for the variable node is received at a third time later than the second time. If decoding at the second stage (i.e., the decoding using the second decoding scheme) was unsuccessful, then the variable node may be decoded using a third decoding scheme after the third time. As described herein, any number of additional stages may be used for receiving additional reliability data (resulting from additional reads of a memory, for example) and for further decoding the variable node. When the decoding is successful, or when a maximum number of stages has been used or a maximum number of additional reads has been performed, the decoding process is terminated.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for decoding data, comprising:
   receiving a variable node value for a variable node at a first time;
   receiving reliability data for the variable node at a second time;
   decoding the variable node using a first decoding scheme after the first time and before the second time;
   decoding the variable node using a second decoding scheme different from the first decoding scheme after the second time; and
   in response to determining that the second decoding scheme was unsuccessful, receiving additional reliability data for the variable node at a third time later than the second time.

2. The method of claim 1, wherein the first decoding scheme is a hard decoding scheme based on the variable node value.

3. The method of claim 1, wherein the second decoding scheme is a soft decoding scheme based on the variable node value and the reliability data.

4. The method of claim 1, further comprising
   decoding the variable node using a third decoding scheme after the third time.

5. The method of claim 1, wherein receiving the variable node value for the variable node comprises transmitting an instruction to perform a read operation on a memory.

6. The method of claim 5, wherein receiving the reliability data for the variable node comprises transmitting an instruction to perform one or more additional read operations on the memory.

7. The method of claim 5, wherein the memory is a NAND flash memory.

8. The method of claim 1, further comprising storing a result of the first decoding scheme in a buffer, wherein decoding the variable node using the second decoding scheme includes retrieving the result of the first decoding scheme from the buffer.

9. The method of claim 1, further comprising:
   determining that the first decoding scheme is successful; and
   terminating the decoding before the second time.

10. The method of claim 1, wherein receiving the reliability data at the second time and decoding the variable node using the second decoding scheme are performed in response to determining that the first decoding scheme is unsuccessful.

11. A decoder comprising decoding circuitry configured to:
   receive a variable node value for a variable node at a first time;
   receive reliability data for the variable node at a second time;
   decode the variable node using a first decoding scheme after the first time and before the second time;
   decode the variable node using a second decoding scheme different from the first decoding scheme after the second time; and
   in response to determining that the second decoding scheme was unsuccessful, receive additional reliability data for the variable node at a third time later than the second time.

12. The decoder of claim 11, wherein the first decoding scheme is a hard decoding scheme based on the variable node value.

13. The decoder of claim 11, wherein the second decoding scheme is a soft decoding scheme based on the variable node value and the reliability data.

14. The decoder of claim 11, wherein the decoding circuitry is further configured to
   decode the variable node using a third decoding scheme after the third time.

15. The decoder of claim 11, wherein the decoding circuitry receives the variable node value for the variable node by transmitting an instruction to perform a read operation on a memory.

16. The decoder of claim 15, wherein the decoding circuitry receives the reliability data for the variable node by transmitting an instruction to perform one or more additional read operations on the memory.

17. The decoder of claim 15, wherein the memory is a NAND flash memory.

18. The decoder of claim 11, wherein the decoding circuitry is further configured to store a result of the first decoding scheme in a buffer, and wherein the decoding circuitry is configured to decode the variable node using the second decoding scheme by retrieving the result of the first decoding scheme from the buffer.

19. The decoder of claim 11, wherein the decoding circuitry is further configured to:
   determine that the first decoding scheme is successful; and
   terminate the decoding before the second time.

20. The decoder of claim 11, wherein the decoding circuitry receives the reliability data at the second time and decodes the variable node using the second decoding scheme in response to determining that the first decoding scheme is unsuccessful.

* * * * *